(12) United States Patent
Hwang

(10) Patent No.: US 9,978,771 B2
(45) Date of Patent: May 22, 2018

(54) MANUFACTURING METHOD OF SEMICONDUCTOR DEVICE INCLUDING MULTI-LAYERED SOURCE LAYER AND CHANNEL EXTENDING THERETHROUGH

(71) Applicant: SK hynix Inc., Gyeonggi-do (KR)

(72) Inventor: Sun Kak Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/350,564

(22) Filed: Nov. 14, 2016

(65) Prior Publication Data

US 2018/0006052 A1    Jan. 4, 2018

(30) Foreign Application Priority Data

Jun. 30, 2016    (KR) .................. 10-2016-0082711

(51) Int. Cl.
*H01L 21/768* (2006.01)
*H01L 27/11582* (2017.01)

(52) U.S. Cl.
CPC .. *H01L 27/11582* (2013.01); *H01L 21/76843* (2013.01); *H01L 21/76879* (2013.01)

(58) Field of Classification Search
None
See application file for complete search history.

(56) References Cited

FOREIGN PATENT DOCUMENTS

KR    1020170065290    6/2017

*Primary Examiner* — Duy T Nguyen
*Assistant Examiner* — Bo Bin Jang
(74) *Attorney, Agent, or Firm* — IP & T Group LLP

(57) ABSTRACT

There are provided a manufacturing method of a semiconductor device. A manufacturing method of a semiconductor device includes forming a preliminary source stack structure including a first source layer, a first protective layer, a sacrificial layer, a second protective layer, and a second source layer, which are sequentially stacked in the recited order, forming channel layers extending through the second source layer and partially inside the first source layer, and growing a first region of an interlayer source layer from each channel layer, the first region of the interlayer source layer surrounding each channel layer in a region between the first and second protective layers.

14 Claims, 16 Drawing Sheets

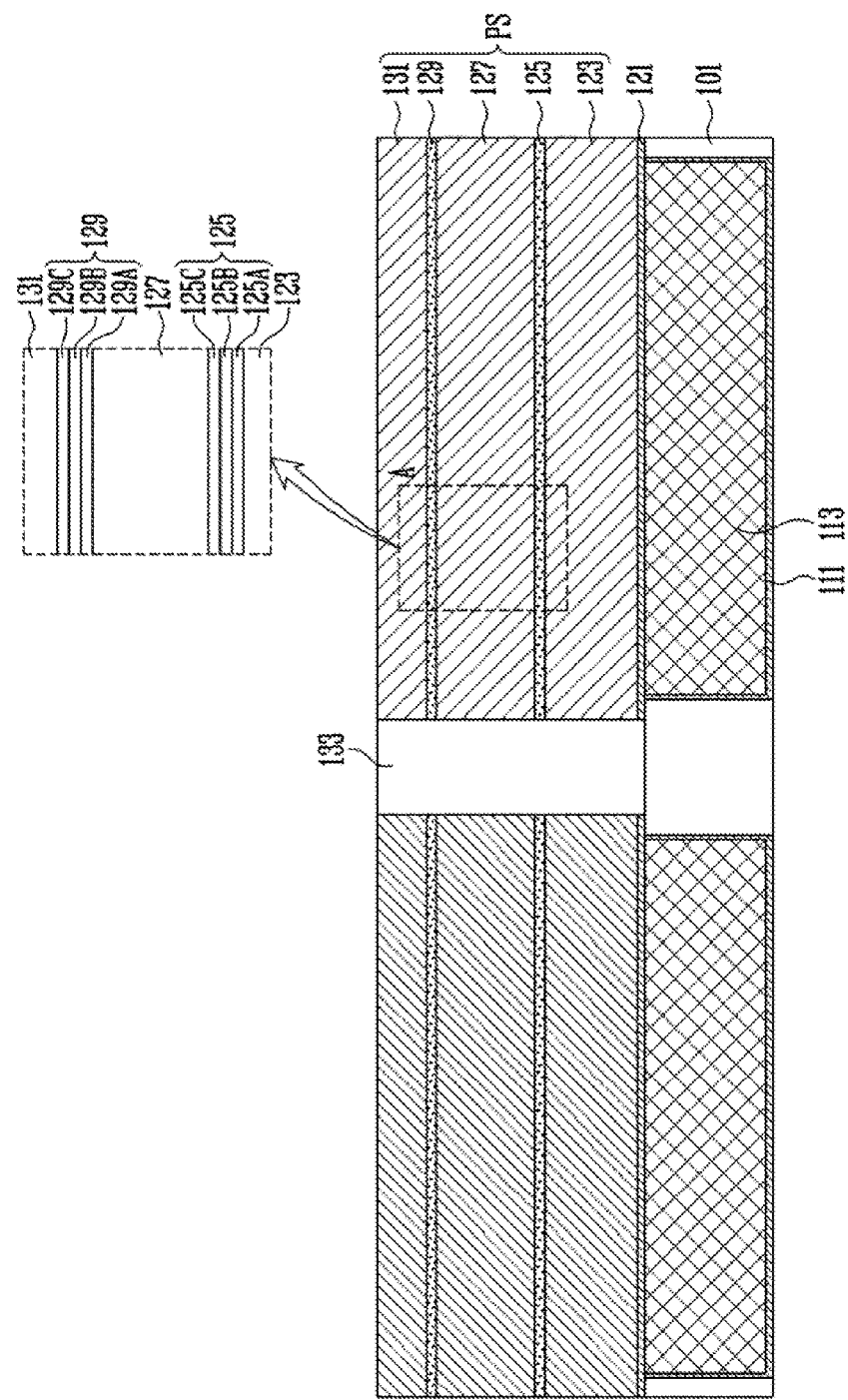

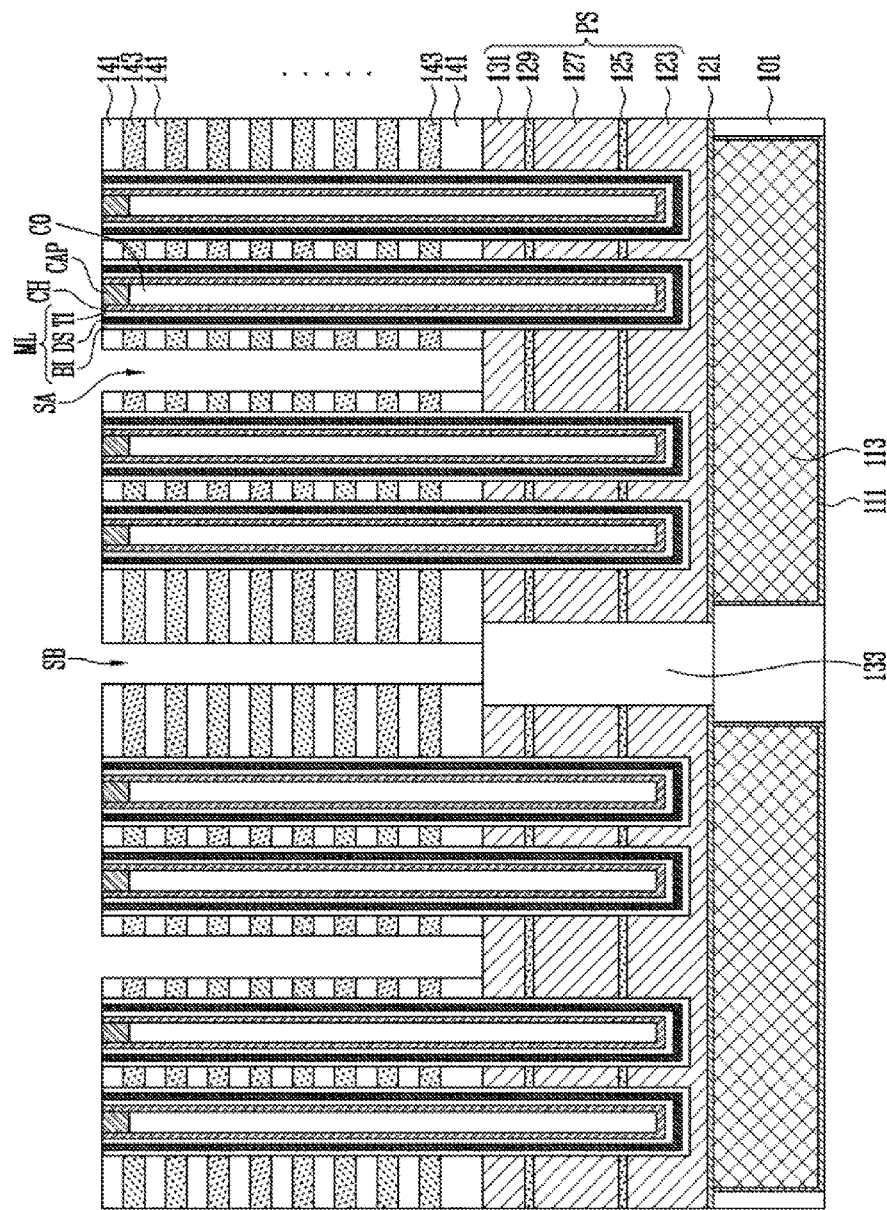

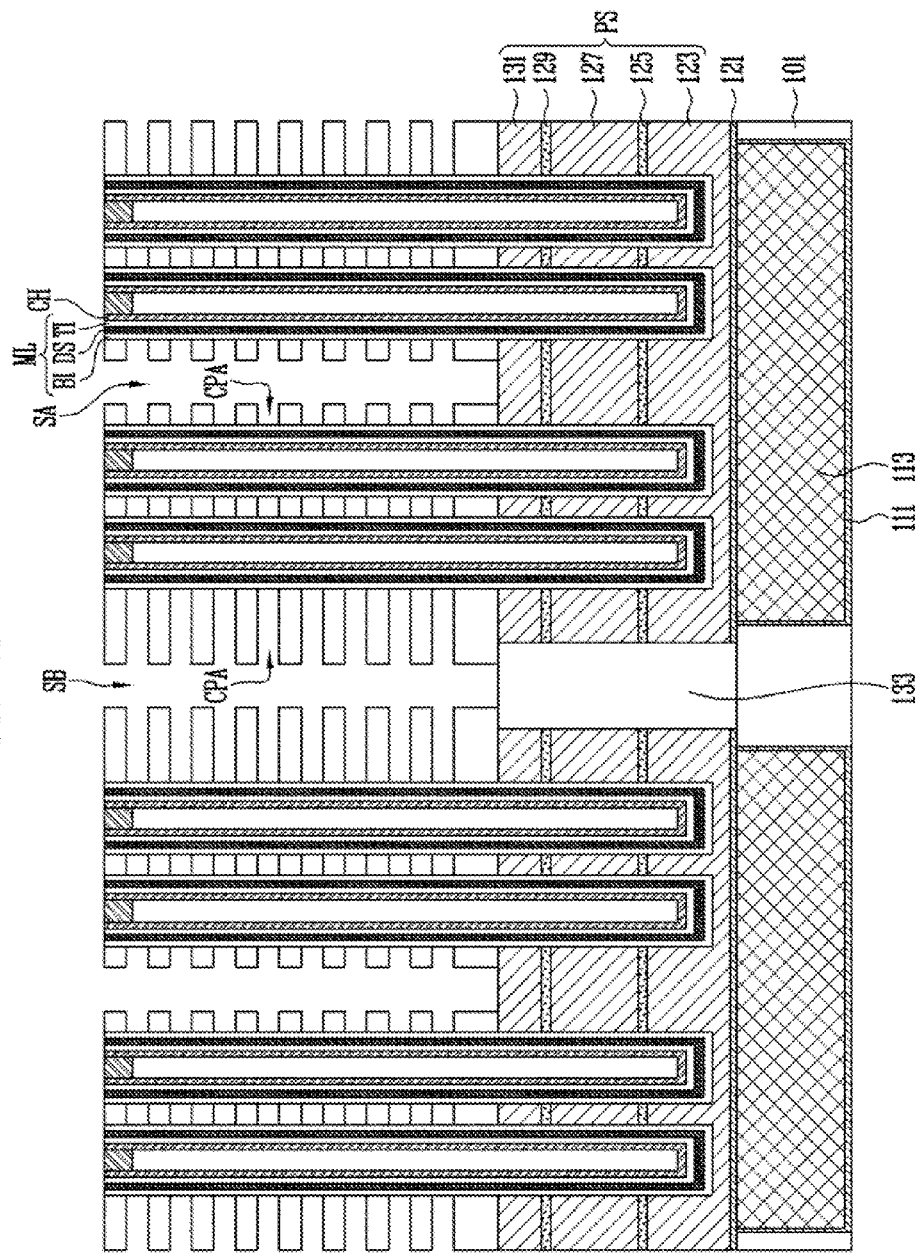

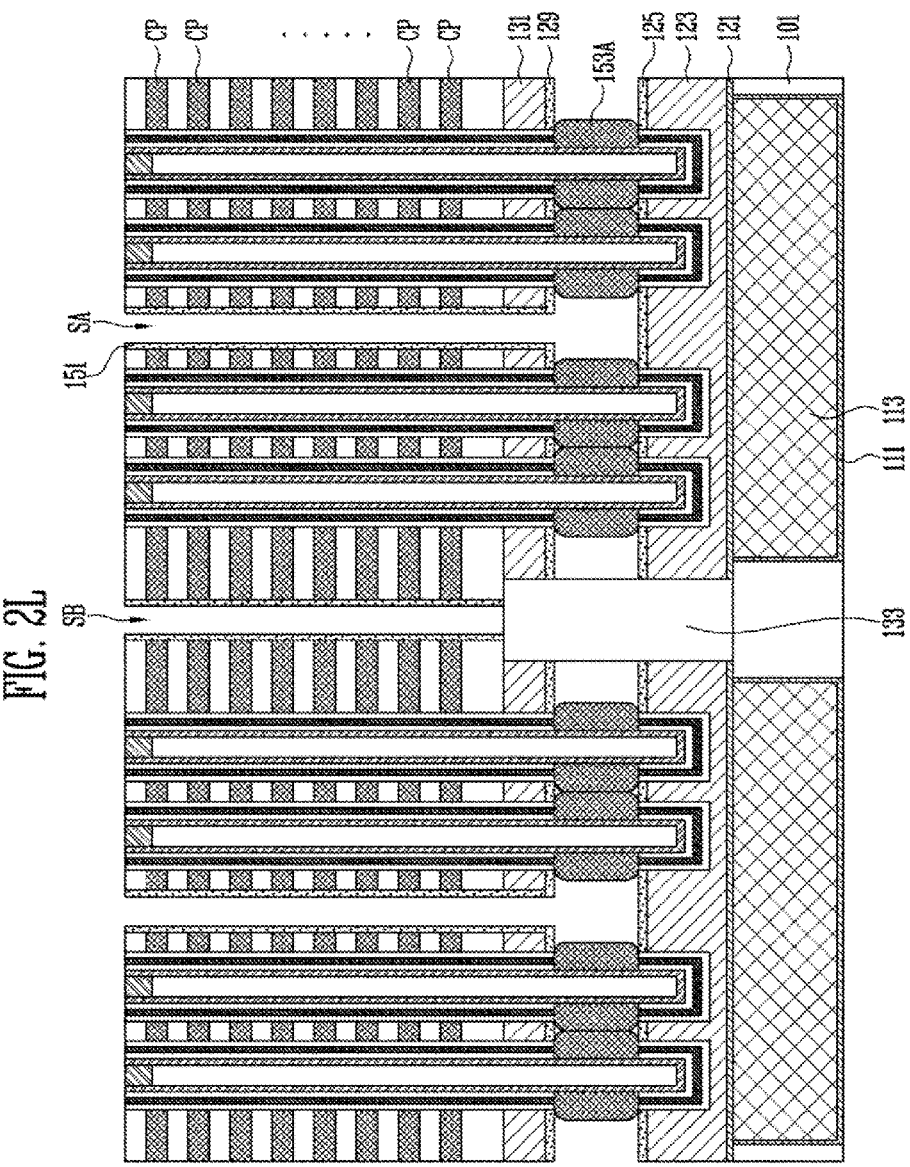

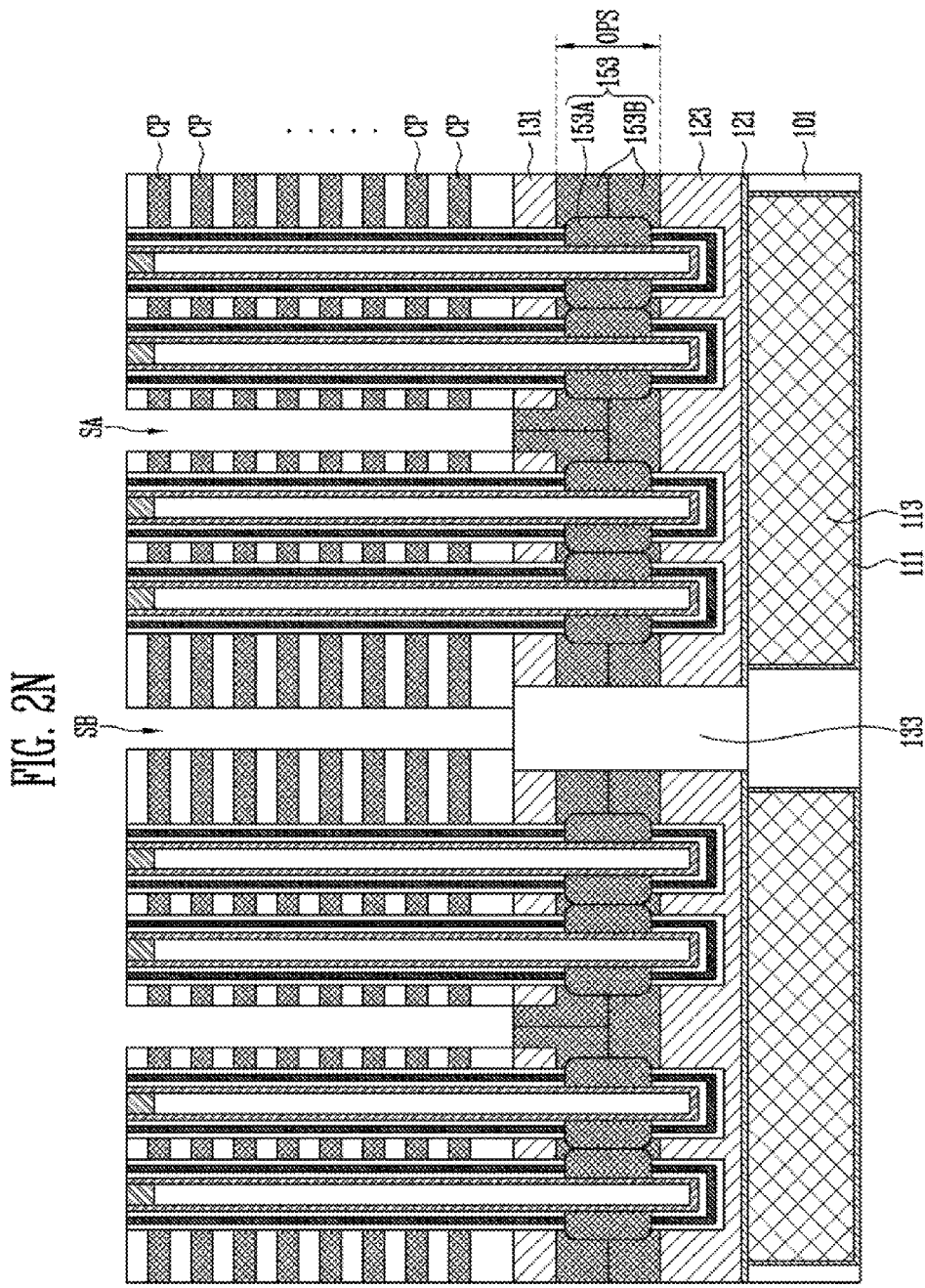

MANUFACTURING METHOD OF SEMICONDUCTOR DEVICE INCLUDING MULTI-LAYERED SOURCE LAYER AND CHANNEL EXTENDING THERETHROUGH

CROSS-REFERENCE TO RELATED APPLICATION

The present application claims priority under 35 U.S.C. § 119(a) to Korean patent application no. 10-2016-0082711, filed on Jun. 30, 2016, which is incorporated herein by reference in its entirety.

BACKGROUND

1. Field

An aspect of the present disclosure relates to a manufacturing method of a semiconductor device, and more particularly, to a manufacturing method of a three-dimensional semiconductor memory device.

2. Description of the Related Art

A semiconductor device typically includes a plurality of memory cells capable of storing data. A three-dimensional semiconductor memory device including three-dimensionally arranged memory cells has been proposed in order to achieve a high degree of integration of semiconductor devices.

The memory cells of a three-dimensional semiconductor memory device may be stacked over each other. The memory cells may be connected in series in units of memory strings through a channel layer. The channel layer may be connected to a bit line and a source layer.

As the number of stacked memory cell increases, connecting the channel layer with the source layer becomes more difficult and current supply to the cells may suffer. As a result, the operational reliability of the semiconductor device may be deteriorated due to a decrease in cell current.

SUMMARY

Various embodiments of the present invention are directed to a manufacturing method of a 3D semiconductor device having improved operational reliability.

According to an aspect of the present disclosure, there is provided a method of manufacturing a semiconductor device, the method including: forming a preliminary source stack structure including a first source layer, a first protective layer, a sacrificial layer, a second protective layer, and a second source layer, which are sequentially stacked in the recited order; forming channel layers extending through the second source layer and partially inside the first source layer; and growing a first region of an interlayer source layer from each channel layer, the first region of the interlayer source layer surrounding each channel layer in a region between the first and second protective layers.

BRIEF DESCRIPTION OF THE DRAWINGS

Example embodiments will now be described more fully hereinafter with reference to the accompanying drawings wherein.

DETAILED DESCRIPTION

Figure 1:
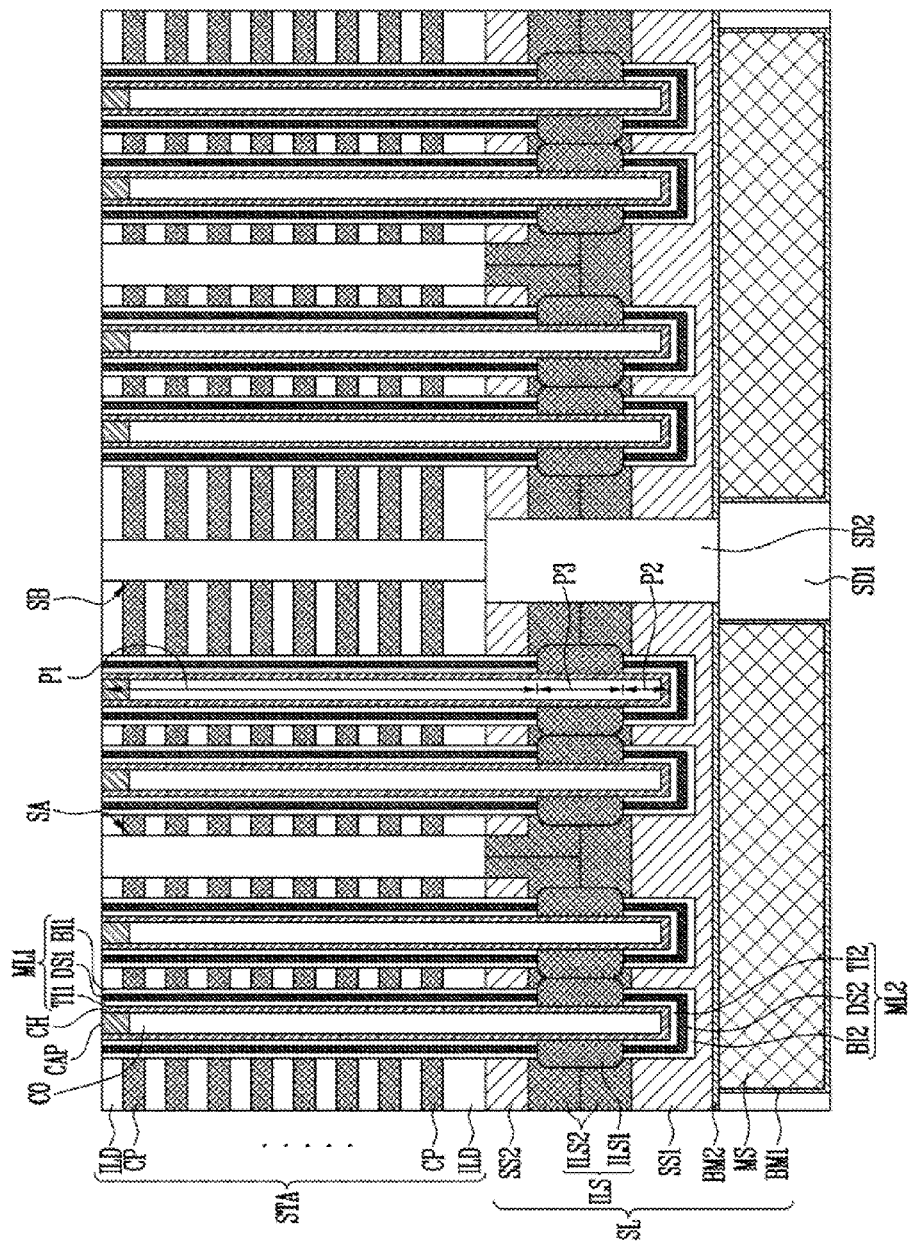
FIG. 1 is a sectional view illustrating a semiconductor device according to an embodiment of the present disclosure.

Example embodiments of the present disclosure will be described with reference to the accompanying drawings. The example embodiments of the present disclosure may, however, be embodied in many different forms and should not be construed as being limited only to the example embodiments set forth herein. Rather, the example embodiments are provided so that disclosure of the present disclosure will be thorough and complete, and will fully convey the present disclosure to those skilled in the art to which the present invention pertains. The features of example embodiments of the present disclosure may be employed in various and numerous embodiments without departing from the scope of the present disclosure. In the drawings, the size and relative sizes of layers and areas may be exaggerated for clarity. The drawings are not to scale. Like reference numerals refer to like elements throughout. In the drawing figures, dimensions may be exaggerated for clarity of illustration. It will be understood that when an element is referred to as being "between" two elements, it can be the only element between the two elements, or one or more intervening elements may also be present.

FIG. 1 is a sectional view illustrating a semiconductor device according to an embodiment of the present disclosure.

Referring to FIG. 1, the semiconductor device according to the embodiment of the present disclosure includes a multi-layered source layer SL, a stack structure STA, and channel layers CH. Although not shown, drive transistors constituting a circuit for driving a memory string of the semiconductor device may be disposed under the multi-layered source layer SL of the semiconductor device. Also, some of the drive transistors and the multi-layered source layer SL may be electrically connected through routing lines or contact plugs disposed therebetween.

As shown in FIG. 1, the multi-layered source layer SL may include a first source layer SS1, an interlayer source layer ILS, and a second source layer SS2.

The second source layer SS2 is disposed over the first source layer SS1 and the interlayer source layer ILS is disposed between the first source layer SS1 and the second source layer SS2. The region between the first and second source layers SS1 and SS2 is referred to also as a source region.

The first source layer SS1 and the second source layer SS2 may be formed of a semiconductor material capable of serving as a growth seed for the interlayer source layer ILS. The first source layer SS1 and the second source layer SS2 may be formed of the same semiconductor material. For example, the first source layer SS1 and the second source layer SS2 may include a semiconductor material such as silicon. Also, the first source layer SS1 and the second source layer SS2 may be formed of a semiconductor material capable of supplying a dopant into the interlayer source layer ILS. For example, the first source layer SS1 and the second source layer SS2 may include an n-type or p-type dopant. In an embodiment the first and second layers SS1 and SS2 are formed of silicon doped with an n-type dopant. In yet another embodiment, the first and second layers SS1 and SS2 are formed of silicon doped with a p-type dopant.

The Interlayer source layer ILS is a material layer grown from the channel layers CH, the first source layer SS1, and the second source layer SS2, and may include silicon. The interlayer source layer ILS may include a dopant supplied from the first source layer SS1 and the second source layer SS2. For example, the interlayer source layer ILS may include an n-type or p-type dopant. The interlayer source layer ILS may supply a dopant into the channel layer CH.

The second source layer SS2 may be formed of polysilicon. The second source layer SS2 may be formed of polysilicon having a high etching selection ratio with respect to oxide so that the second source layer SS2 may serve as an etch stop layer in a process of forming slits SA and SB which will be described later.

Referring to FIG. 1, the multi-layered source layer SL may further include a metal source layer MS disposed under the first source layer SS1. The metal source layer MS may be formed of a material having a lower resistance than the first source layer SS1, the second source layer SS2, and the interlayer source layer ILS. For example, the metal source layer MS may be or include tungsten.

The metal source layer MS may be penetrated by a first source insulating layer SD1 to be divided into a plurality of patterns. The first source layer SS1, the interlayer source layer ILS and the second source layer SS2 may be penetrated by a second source insulating layer SD2 to be divided into a plurality of patterns. The second source insulating layer SD2 may be disposed on the first source insulating layer SD1.

A first barrier metal layer BM1 may be further formed between the sidewalls of the first source insulating layer SD1 and the metal source layer MS and along a bottom surface of the metal source layer MS. That is, the first barrier metal layer BM1 may surround the sidewall and bottom surface of the metal source layer MS. A second barrier metal layer BM2 may be further formed between the first source layer SS1 and the metal source layer MS. The second barrier metal layer BM2 may be penetrated by the second source insulating layer SD2 so that the first and second source insulating layers SD1 and SD2 are in contact.

The stack structure STA is disposed on the multi-layered source layer SL and the second source insulating layer SD2. The stack structure STA includes a plurality of interlayer insulating layers ILD and a plurality of conductive patterns CP, which are alternately stacked with a first interlayer insulating layer among the plurality of interlayer insulating layers ILD formed directly over the second source layer SS2. The conductive patterns CP may be used as gate electrodes of select transistors and memory cells. The interlayer insulating layers ILD are used to insulate the conductive patterns CP from one another. The conductive patterns CP may be or include at least one of polysilicon, metal, and metal silicide. The interlayer insulating layers ILD may be or include an oxide such as silicon dioxide.

The stack structure STA may be penetrated by the slits SA and SB which extend through the stack structure in a direction that is substantially perpendicular to the plane of the stack structure. The slits SA and SB may include a first slit SA and a second slit SB. The first slit SA is disposed to overlap with the multi-layered source layer SL, and may be formed to penetrate the second source layer SS2 of the multi-layered source layer SL. The second slit SB may be disposed to partially overlap the second source insulating layer SD2. The second slit SB may have a cross-section area that is smaller than a cross-section of the second source insulating layer SD2 and may be disposed substantially centrally over the second source insulating layer SD2. The second slit SB exposes a central portion of the top surface of the second source insulating layer SD2. Although not shown in this figure, a sidewall insulating layer and a slit insulating layer may be formed inside each of the slits SA and SB. The sidewall insulating layer is formed to protect the interlayer insulating layers ILD, the conductive patterns CP, and the second source layer SS2 from an etching process. The sidewall insulating layer may be formed of a different material from the interlayer insulating layers ILD, the conductive patterns CP, and the second source layer SS2. The sidewall insulating layer is formed on a sidewall of each of the slits SA and SB, and the slit insulating layer may be formed to fill in each of the slits SA and SB on the sidewall insulating layer.

Each of the channel layers CH is disposed inside a channel hole extending to the inside of the first source layer SS1 by penetrating the stack structure STA and the second source layer SS2. Each of the channel layers CH may be formed in a tubular shape surrounding a core insulating layer CO. In this case, the core insulating layer CO may have a lower height than the channel layers CH so that a capping layer CAP may be further formed over the core insulating layer CO. The capping layer CAP may be surrounded by an upper end region of any one of the channel layers CH corresponding thereto. The channel layers CH and the capping layer CAP may be formed of a semiconductor material. The capping layer CAP may include a dopant having a higher concentration than the channel layers CH. In a different embodiment, not shown in this figure, each of the channel layers CH may be formed in a buried shape in which it is completely filled in the channel hole thus without forming the capping layer CAP and the core insulating layer CO. Each of the channel layers CH may be used as a channel of a memory string. The first slit SA may be disposed between adjacent channel layers CH.

Each of the channel layers CH may be divided into first to third parts P1 to P3. The first part P1 penetrates the stack structure STA and the second source layer SS2. The second part P2 penetrates a partial upper portion of the first source layer SS1. The third part P3 is disposed between the first part P1 and the second part P2. The third part P3 of each of the channel layers CH penetrates the interlayer source layer ILS and is in direct contact with the interlayer source layer ILS.

The interlayer source layer ILS is divided into a first interlayer source region ILS1 and a second interlayer source region ILS2, which are formed at different times in the manufacturing process. For example, the first interlayer source region ILS1 may be formed first, and the second interlayer source region ILS2 may be formed after the first interlayer source region ILS1 is formed. The first interlayer source region ILS1 and the second interlayer source region ILS2 are disposed in the source region between the first source layer SS1 and the second source layer SS2. The first interlayer source region ILS1 is grown from the channel layers CH to fill in spaces between the channel layers CH. More specifically, the first interlayer source region ILS1 may be grown laterally from the third part P3 of each of the channel layers CH. In addition, the second interlayer source region ILS2 may be formed later using various processes such as a deposition process and a selective growth process. For example, the second interlayer source region ILS2 formed through the selective growth process may be grown from the first interlayer source region ILS1 and the first and second source layers SS1 and SS2 using, as growth seed layers, the first interlayer source region ILS1 and the first and second source layers SS1 and SS2. The second interlayer source region ILS2 may be formed to fill between the first interlayer source region ILS1 and the first source layer SS1 and between the first interlayer source region ILS1 and the second source layer SS2. If the first interlayer source region ILS1 close to the channel layers CH is formed earlier than the second interlayer source region ILS2 as described above, the flow path of materials required to be grown is prevented from being blocked during the growing of the interlayer source layer ILS, so that the interlayer source layer ILS can be easily formed without any void around the channel layers CH. Hence, the region between the channel layer and the interlayer source layer is substantially free of any voids. Accordingly, in the embodiment of the present disclosure, it is possible to decrease interface resistance between the channel layers CH and the interlayer source layer ILS and to increase cell current.

An outer wall of the first part P1 of each of the channel layers CH may be surrounded by a first multi-layered pattern ML1. The first multi-layered pattern ML1 may include a first tunnel insulating pattern TI1 surrounding an outer wall of the first part P1, a first data storage pattern DS1 surrounding the first tunnel insulating pattern TI1, and a first blocking insulating pattern BI1 surrounding the first data storage pattern DS1. An outer wall of the second part P2 of each of the channel layers CH may be surrounded by a second multi-layered pattern ML2. The second multi-layered pattern ML2 may include a second tunnel insulating pattern TI2 surrounding an outer wall of the second part P2, a second data storage pattern DS2 surrounding the second tunnel insulating pattern TI2, and a second blocking insulating pattern BI2 surrounding the second data storage pattern DS2.

The first multi-layered pattern ML1 and the second multi-layered pattern ML2 may be isolated by the interlayer source layer ILS. The first tunnel insulating pattern TI1 and the second tunnel insulating layer TI2 are parts of a tunnel insulating layer isolated through the interlayer source layer ILS. The first data storage pattern DS1 and the second data storage pattern DS2 are parts of a data storage layer isolated through the interlayer source layer ILS. The first blocking insulating pattern BI1 and the second blocking insulating pattern BI2 are parts of a blocking insulating layer isolated through the interlayer source layer ILS. The data storage layer may include any suitable material such as, for example, silicon, nitride, a phase change material, nanodots. The tunnel insulating layer may include a silicon oxide layer through which charges can tunnel. The blocking insulating layer may include an oxide layer capable of blocking charges.

According to an embodiment of the present disclosure, a select transistor is formed at an intersection of a select line among the conductive patterns CP and the channel layer CH, and a memory cell is formed at an intersection of a word line among the conductive patterns CP and the channel layer CH. An uppermost conductive pattern and a lowermost conductive pattern among the conductive patterns CP may be used as an upper select line and a lower select line, respectively. Among the conductive patterns CP, patterns disposed between the uppermost conductive pattern and the lowermost conductive pattern may be used as word lines. According to the above-described structure, each of the channel layers CH may connect, in series, an upper select transistor connected to the upper select line, a lower select transistor connected to the lower select line, and memory cells connected to the word lines. The memory string includes an upper select transistor, memory cells, and a lower select transistor, which are connected in series.

Figure 2A:
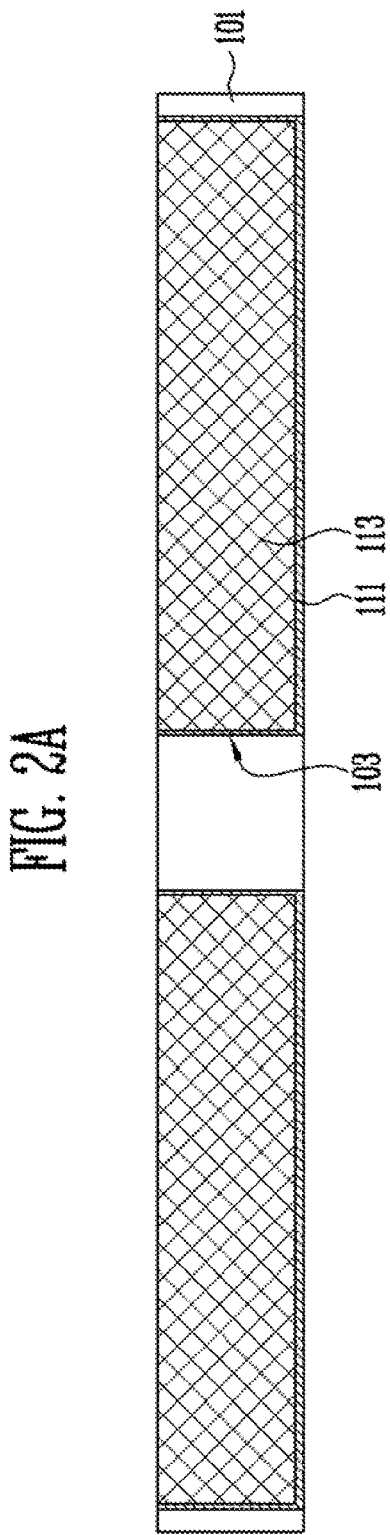
FIGS. 2A to 2N are sectional views illustrating a manufacturing method of a semiconductor device according to an embodiment of the present disclosure.

FIGS. 2A to 2N are cross-sectional views illustrating a manufacturing method of a semiconductor device according to an embodiment of the present disclosure. More specifically, FIGS. 2A to 2N are cross-sectional views illustrating a manufacturing method of the semiconductor device shown in FIG. 1.

First, referring to FIG. 2A, a metal source layer 113 may be formed on a substrate (not shown) including a lower structure. The lower structure may include drive transistors (not shown) constituting a circuit for driving a memory string of the semiconductor device, and routing lines and contact plugs, which are connected to the drive transistors.

The metal source layer 113 may be formed of a metal having a lower resistance than first and second source layers to be formed in a subsequent process. For example, the metal source layer 113 may be or include tungsten. In another embodiment, the metal source layer 113 may be or include copper.

The metal source layer 113 may be formed through a damascene process. For example, a first source insulating layer 101 is formed on the substrate including the lower structure. Subsequently, the first source insulating layer 101 may be etched to form trenches 103. After that, each of the trenches 103 is filled with the metal source layer 113. A first barrier metal layer 111 may be further formed before the metal source layer 113 is formed. The first barrier metal layer 111 may be formed on a surface of each of the trenches 103. The metal source layer 113 is disposed on the first barrier metal layer 111, and is completely filled in each of the trenches 103. After the first barrier metal layer 111 and the metal source layer 113 are formed, the metal source layer 113 and the first barrier metal layer 111 may be planarized until the first source insulating layer 101 is exposed using for example a chemical mechanical planarization process.

Next, referring to FIG. 2B, a preliminary source stack structure PS may be formed on the first source insulating layer 101 including the metal source layer 113. Before the preliminary source stack structure PS is formed, a second barrier metal layer 121 may be further formed on the first source insulating layer 101 including the metal source layer 113 so as to prevent metal diffusion from the metal source layer 113 to the surrounding structures.

The preliminary source stack structure PS may be formed by sequentially stacking a first source layer 123, a sacrificial layer 127, and a second source layer 131. The first source layer 123 and the second source layer 131 may be used as growth seed layers of an interlayer source layer in a subsequent process. The first source layer 123 and the second source layer 131 may be formed of the same material. The first source layer 123 and the second source layer 131 may be formed of a material capable of supplying a dopant into the interlayer source layer in a subsequent process. The sacrificial layer 127 may be formed of a selectively removable material in a subsequent process. More specifically, the sacrificial layer 127 may be formed of a material having a different etching selection ratio from the first source layer 123 and the second source layer 131. The first source layer 123 and the second source layer 131 may serve as growth seed layers of the interlayer source layer, and may be formed of a doped silicon layer capable of supplying a dopant into the interlayer source layer. The doped silicon layer may include an n-type or p-type dopant. The dopant may be added through an implantation process after each of the first source layer 123 and the second source layer 131 is deposited. The sacrificial layer 127 may be formed of an undoped polysilicon layer.

The preliminary source stack structure PS may further include a first protective layer 125 and a second protective layer 129. In order for the sacrificial layer 127 to be interposed between the first protective layer 125 and the second protective layer 129. The first protective layer 125 may be deposited before the sacrificial layer 127 is formed, and the second protective layer 129 may be deposited after the sacrificial layer 127 is formed. The first protective layer 125 is disposed between the sacrificial layer 127 and the first source layer 123, and the second protective layer 129 is disposed between the sacrificial layer 127 and the second source layer 131. The first protective layer 125 and the second protective layer 129 may be formed of a material having a different etching selection ratio from the first source layer 123, the sacrificial layer 127, and the second source layer 131. Also, the first protective layer 125 and the second protective layer 129 may be formed by considering an etching selection ratio with respect to a multi-layered layer to be formed in a subsequent process.

In more detail, referring to a sectional view obtained by enlarging region A in FIG. 2B, each of the first protective layer 125 and the second protective layer 129 may be formed in multiple layers. More specifically, the first protective layer 125 may include first to third sub-protective layers 125A to 125C sequentially disposed on the first source layer 123. The second protective layer 129 may include first to third sub-protective layers 129A to 129C sequentially disposed on the sacrificial layer 127.

The first sub-protective layer 125A disposed at the lowermost portion of the first protective layer 125 may be formed of a different material from the tunnel insulating layer described in FIG. 1. For example, the first sub-protective layer 125A may be formed of a nitride layer.

The third sub-protective layer 125C disposed at the uppermost portion of the first protective layer 125 may be formed of a different material from the blocking insulating layer described in FIG. 1. For example, the third sub-protective layer 125C may be formed of a nitride layer.

The second sub-protective layer 125B between the first sub-protective layer 125A and the third sub-protective layer 125C may be formed of a different material from the data storage layer described in FIG. 1. For example, the second sub-protective layer 125B may be formed of an oxide layer.

In addition, the first sub-protective layer 129A disposed at the lowermost portion of the second protective layer 129 may be formed of a different material from the blocking insulating layer described in FIG. 1. For example, the first sub-protective layer 129A may be formed of a nitride layer.

The third sub-protective layer 129C disposed at the uppermost portion of the second protective layer 129 may be formed of a different material from the tunnel insulating layer described in FIG. 1. For example, the third sub-protective layer 129C may be formed of a nitride layer.

The second sub-protective layer 129B between the first sub-protective layer 129A and the third sub-protective layer 129C may be formed of a different material from the data storage layer described in FIG. 1. For example, the second sub-protective layer 129B may be formed of an oxide layer.

The multi-layered first and second protective layers 125 and 129 including the above-described materials may serve as protective layers during a process of etching the blocking insulating layer, the data storage layer, and the tunnel insulating layer so as to expose channel layers in a subsequent process. Each of the first protective layer 125 and the second protective layer 129 may be formed in a stack structure of oxide layer/nitride layer/oxide layer/nitride layer, in addition to the above-described stack structure of nitride layer/oxide layer/nitride layer.

As shown in FIG. 2B, after the preliminary source stack structure PS is formed, a second source insulating layer 133 may be further formed, which contacts the first source insulating layer 101 on the first source insulating layer 101 by penetrating the preliminary source stack structure PS.

Figure 2C:
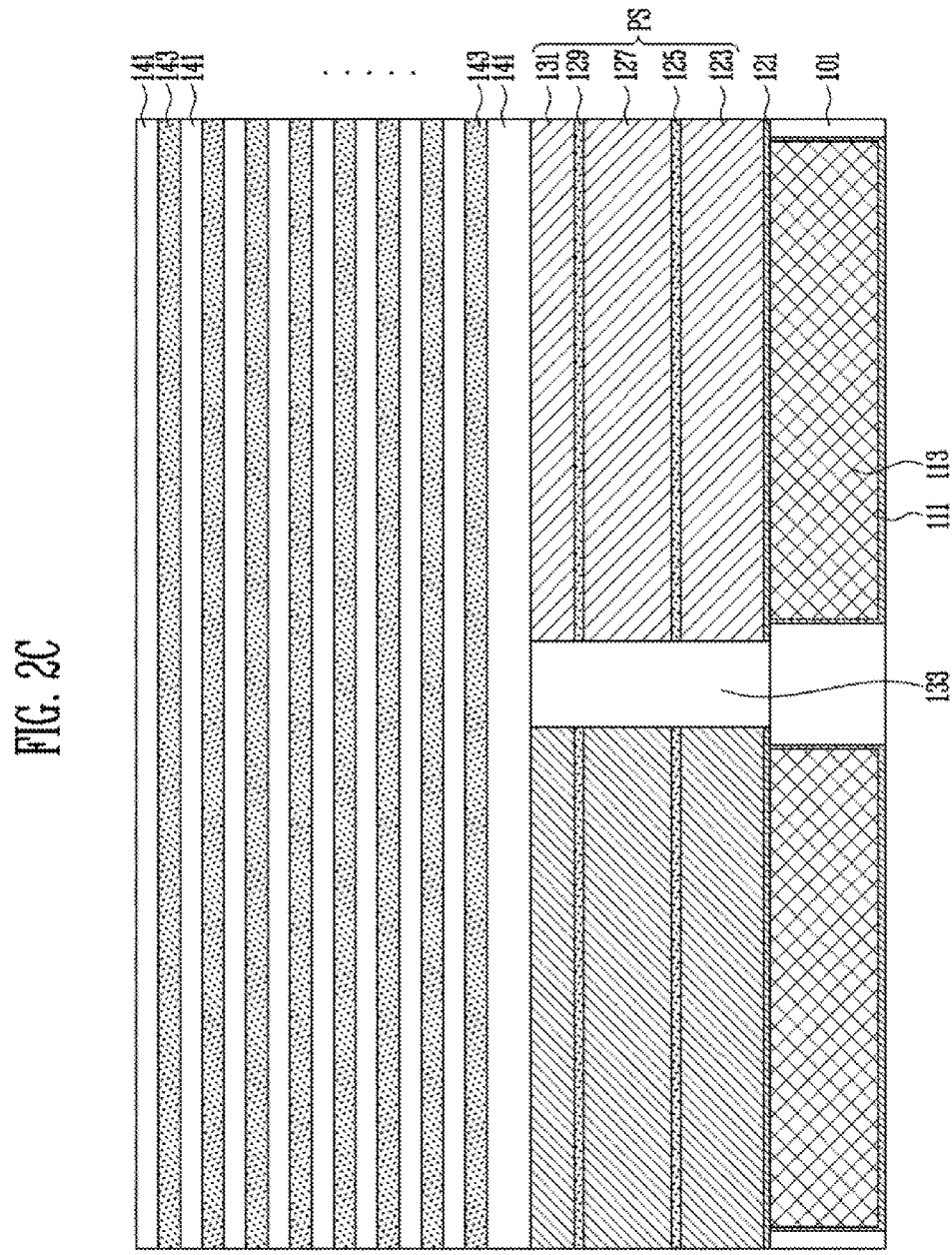

Next, referring to FIG. 2C, first material layers 141 and second material layers 143 are alternately stacked on the second source layer 131 and the second source insulating layer 133.

The second material layers 143 are formed of a different material from the first material layers 141. For example, the first material layers 141 may be formed of an insulating material for interlayer insulating layers, and the second material layers 143 may be formed of a conductive material for conductive patterns.

Alternatively, the first material layers 141 may be formed of an insulating material for interlayer insulating layers, and the second material layers 143 may be formed of a sacrificial insulating material that is used for sacrificial layers and has a different etching selection ratio from the first material layers 141. In an embodiment, the first material layers 141 may be formed of a silicon oxide layer, and the second material layers 143 may be formed of a silicon nitride layer.

Alternatively, the first material layers may be formed of a sacrificial conductive material that is used for sacrificial layers and has a different etching selection ratio from the second material layers 143, and the second material layers 143 may be formed of a conductive material for conductive patterns. In this case, the first material layers 141 may be formed of an undoped polysilicon layer, and the second material layers 143 may be formed of a doped polysilicon layer.

Figure 2D:
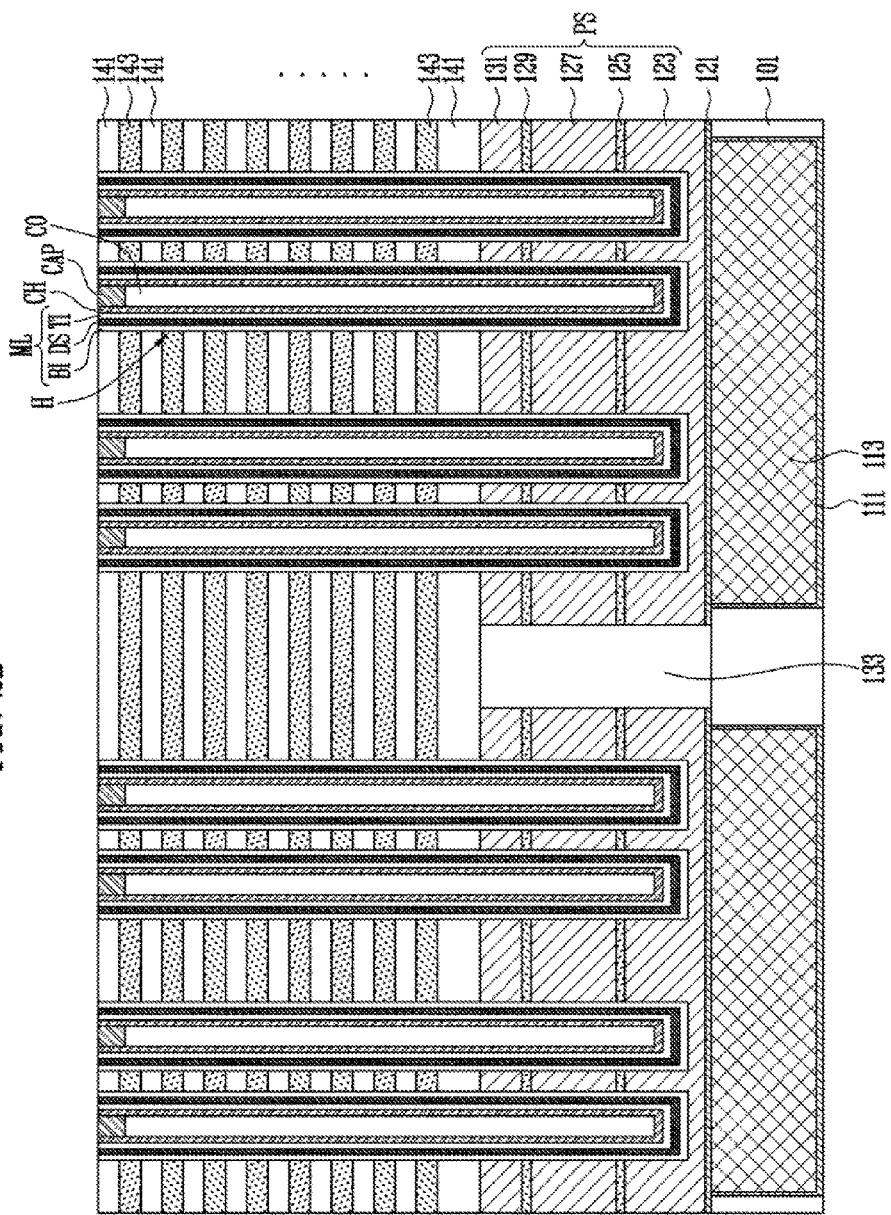

Next, referring to FIG. 2D, channel holes H are formed, which penetrate the first and second material layers 141 and 143 and the preliminary source stack structure PS. The channel holes H may extend to completely penetrate the second source layer 131, the second protective layer 129, the sacrificial layer 127, and the first protective layer 125 of the preliminary source stack structure PS. The channel holes H may extend to penetrate only a portion of the first source layer 123 of the preliminary source stack structure PS.

Subsequently, a channel layer CH surrounded by a multi-layered layer ML is formed inside each of the channel holes H. The multi-layered layer ML may be formed by sequentially stacking a blocking insulating layer BI, a data storage layer DS, and a tunnel insulating layer TI. The blocking insulating layer BI, the data storage layer DS, and the tunnel insulating layer TI may be formed on a surface of each of the channel holes H. The channel layer CH may be formed on the tunnel insulating layer TI. The channel layer CH may be formed to completely fill in each of the channel holes H, or may be formed to open a central region of each of the channel holes H. When the central region of each of the channel holes H is opened by the channel layer CH, the central region of each of the channel holes H may be filled with a core insulating layer CO. In the illustrated embodiment, the core insulating layer CO may be formed lower than each of the channel holes H and a capping layer CAP may be further formed on the core insulating layer CO, so that an upper end region of each of the channel holes H is filled with the capping layer CAP.

Referring now to FIG. 2E, the first and second material layers 141 and 143 are etched, thereby forming first and second slits SA and SB penetrating the first and second material layers 141 and 143. The first slit SA may be penetrating the first and second material layers 141 and 143 between the channel layers CH, and the second slit SB may be penetrating the first and second material layers 141 and 143 overlapping with the second source insulating layer 133.

When the first material layers 141 are formed of an insulating material for interlayer insulating layers and the second material layers 143 are formed of a sacrificial insulating material, a difference in etching selection ratio between the second source layer 131 formed of a conductive material such as doped silicon and the first and second material layers 141 and 143 formed of an insulating material may be exploited to form the slits SA and SB with a uniform depth. More specifically, when an etching process of the first and second material layers 141 and 143 formed of the insulating material is performed, the second source layer 131 formed of the conductive material may be used as an etch stop layer. Accordingly, the slits SA and SB can be formed with a uniform depth.

Figure 2G:
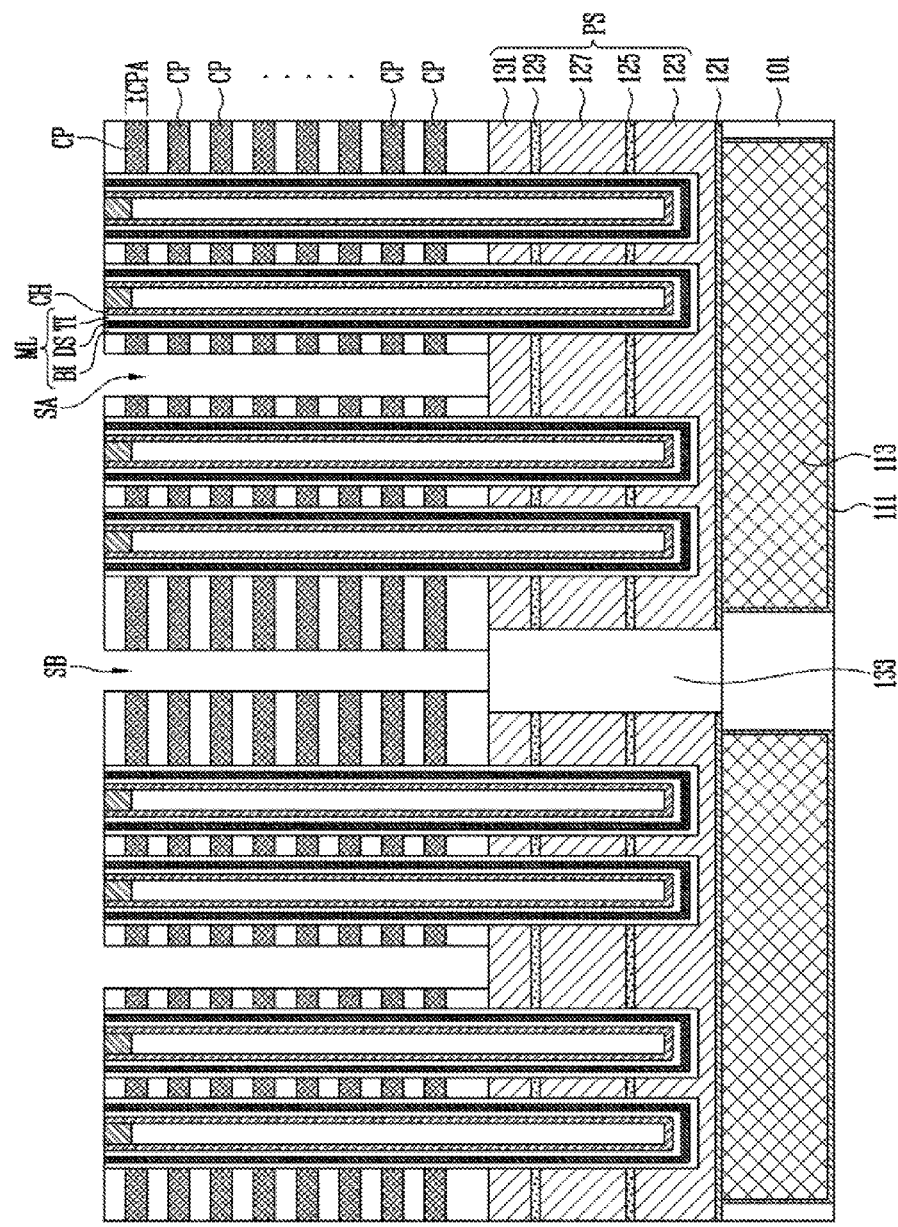

The following FIGS. 2F and 2G illustrate subsequent processes when the first material layers 141 are formed of an insulating layer for interlayer insulating layers and the second material layers 143 are formed of a sacrificial insulating material.

First, referring to FIG. 2F, the second material layers 143 are selectively removed by selective etching by injecting an etchant through the slits SA and SB, thereby opening conductive pattern regions CPA. At this time, the channel layers CH are supported by the preliminary source stack structure PS, and thus their structures can be stably maintained.

Then, referring to FIG. 2G, each of the conductive pattern regions CPA may be filled with a third material layer through the slits SA and SB. The third material layer may be a conductive material. Accordingly, conductive patterns CP are formed inside the conductive pattern regions CPA. The conductive patterns CP may be or include tungsten, copper and the like. Although not shown in this figure, before the conductive patterns CP are formed, at least one of a barrier layer and a blocking insulating layer may be further formed along a surface of each of the conductive pattern regions CPA.

Unlike the description of FIGS. 2F and 2G, when the first material layers 141 is formed of an insulating material for interlayer insulating layers and the second material layers 143 are formed of a conductive material for conductive patterns, the second material layers 143 may be separated as the conductive patterns CP through the slits SA and SB.

Alternatively, when the first material layers 141 are formed of a sacrificial conductive material and the second material layers 143 are formed of a conductive material for conductive patterns, each of the first material layers 141 may be replaced with a third material layer as an insulating material, and the second material layers 143 may be separated as the conductive patterns CP through the slits SA and SB.

Figure 2H:
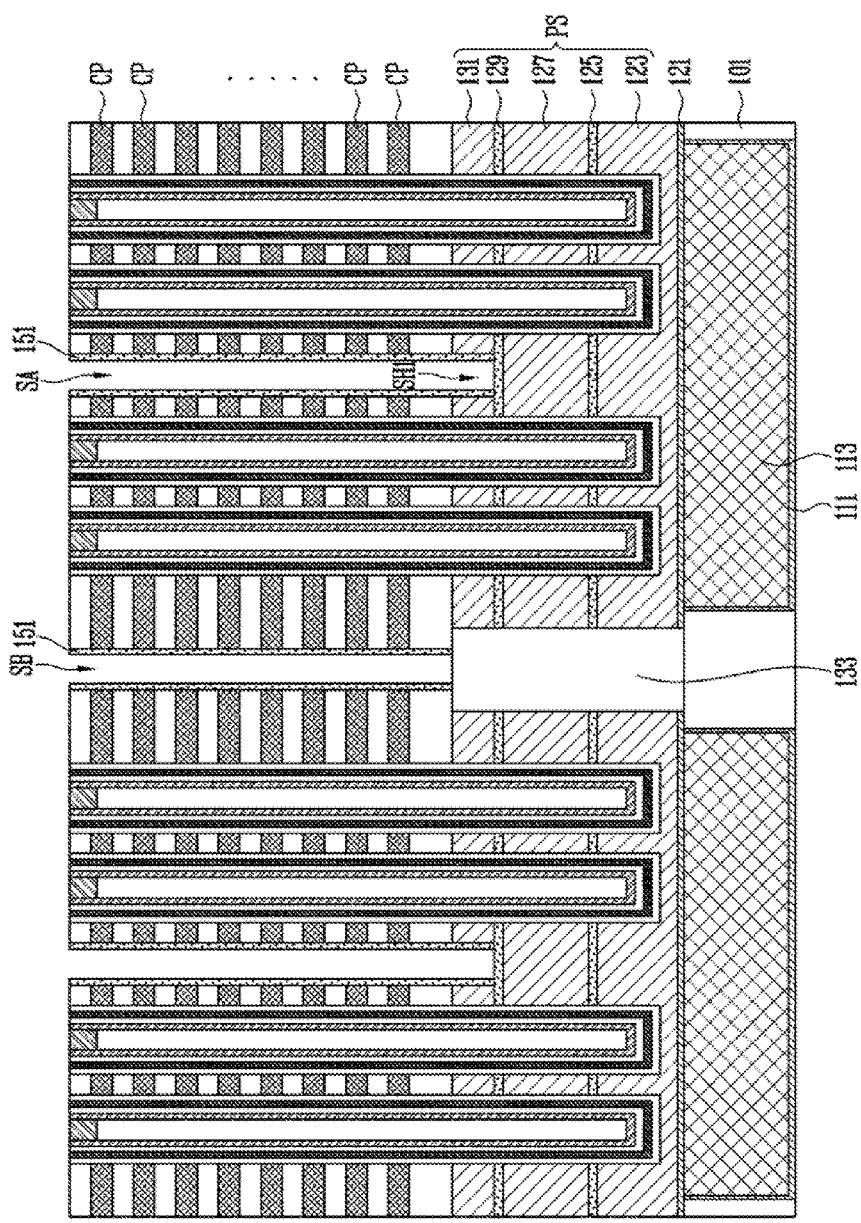

Next, referring to FIG. 2H, the second source layer 131 exposed through the first slit SA is etched, thereby forming a first source penetration hole SH1 penetrating the second source layer 131. The second protective layer 129 is exposed through the first source penetration hole SH1 penetrating the second source layer 131. In this case, the second protective layer 129 may be used as an etch stop layer, using a difference in etching selection ratio between the second source layer 131 and the second protective layer 129. Accordingly, it is possible to prevent irregular loss of the sacrificial layer 127.

After that, a sidewall insulating layer 151 may be formed on sidewalls of the slits SA and SB. The sidewall insulating layer 151 may be formed in a single layer of a nitride layer, or may be formed in a multi-layered structure including a nitride layer and an oxide layer. The sidewall insulating layer 151 may protect the conductive patterns CP and the second source layer 131 during a subsequent process of removing the sacrificial layer 127. The sidewall insulating layer 151 may be formed of the same material layer as the first protective layer 125 or the second protective layer 129. For example, the sidewall insulating layer 151 may be formed in a multi-layered structure of nitride layer/oxide layer/nitride layer or a multi-layered structure of oxide layer/nitride layer/oxide layer/nitride layer.

Figure 2I:
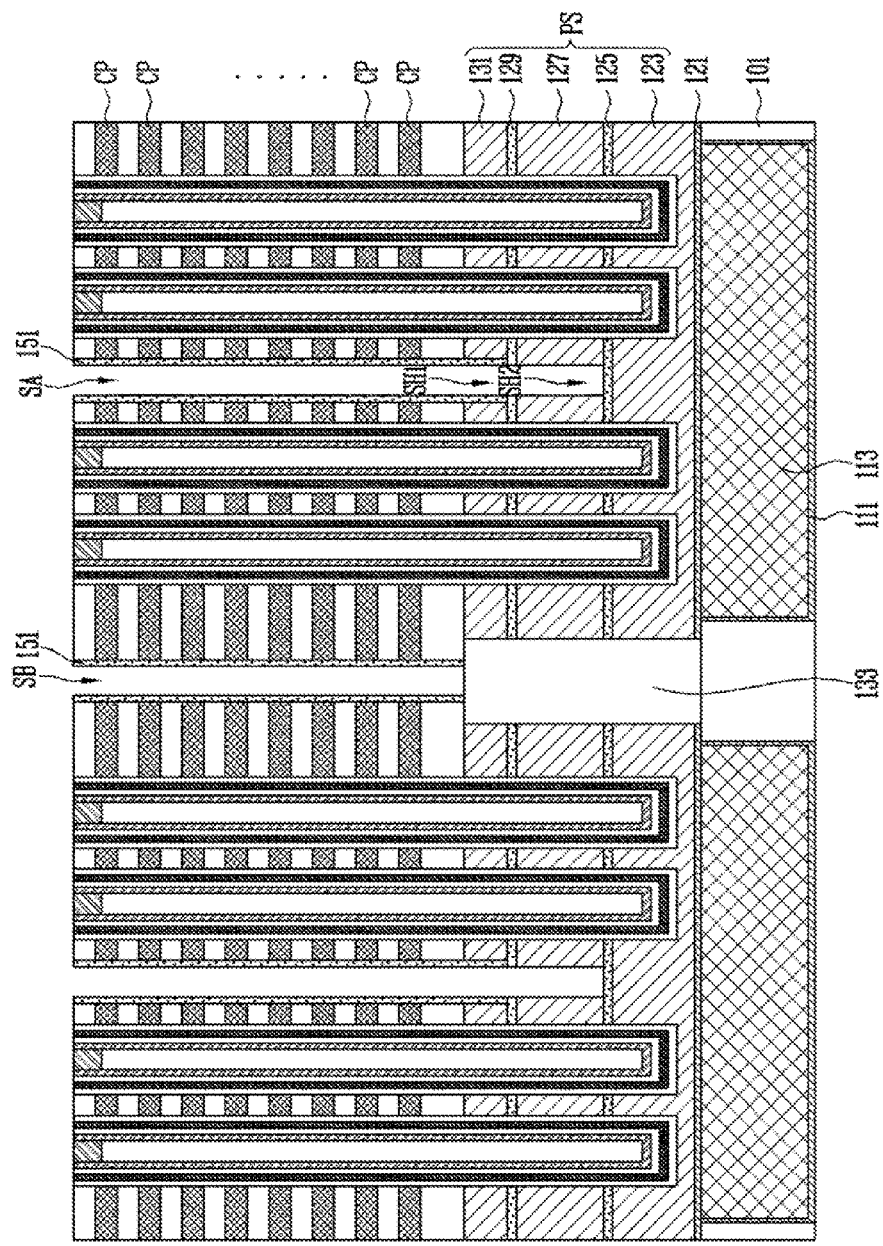

Next, referring to FIG. 2I, a step of etching the second protective layer 129 exposed through the first source penetration hole SH1 and a step of etching the sacrificial layer 127 are sequentially performed, thereby forming a second source penetration hole SH2. The first protective layer 125 is exposed through the second source penetration hole SH2 penetrating the second protective layer 129 and the sacrificial layer 127. In the step of etching the sacrificial layer 127, the first protective layer 125 may be used as an etch stop layer, using a difference in etching selection ratio between the sacrificial layer 127 and the first protective layer 125. Accordingly, it is possible to prevent loss of the first source layer 123.

The etching process for forming the second source penetration hole SH2 vertically penetrating the sacrificial layer 127 may be omitted when necessary.

Figure 2J:
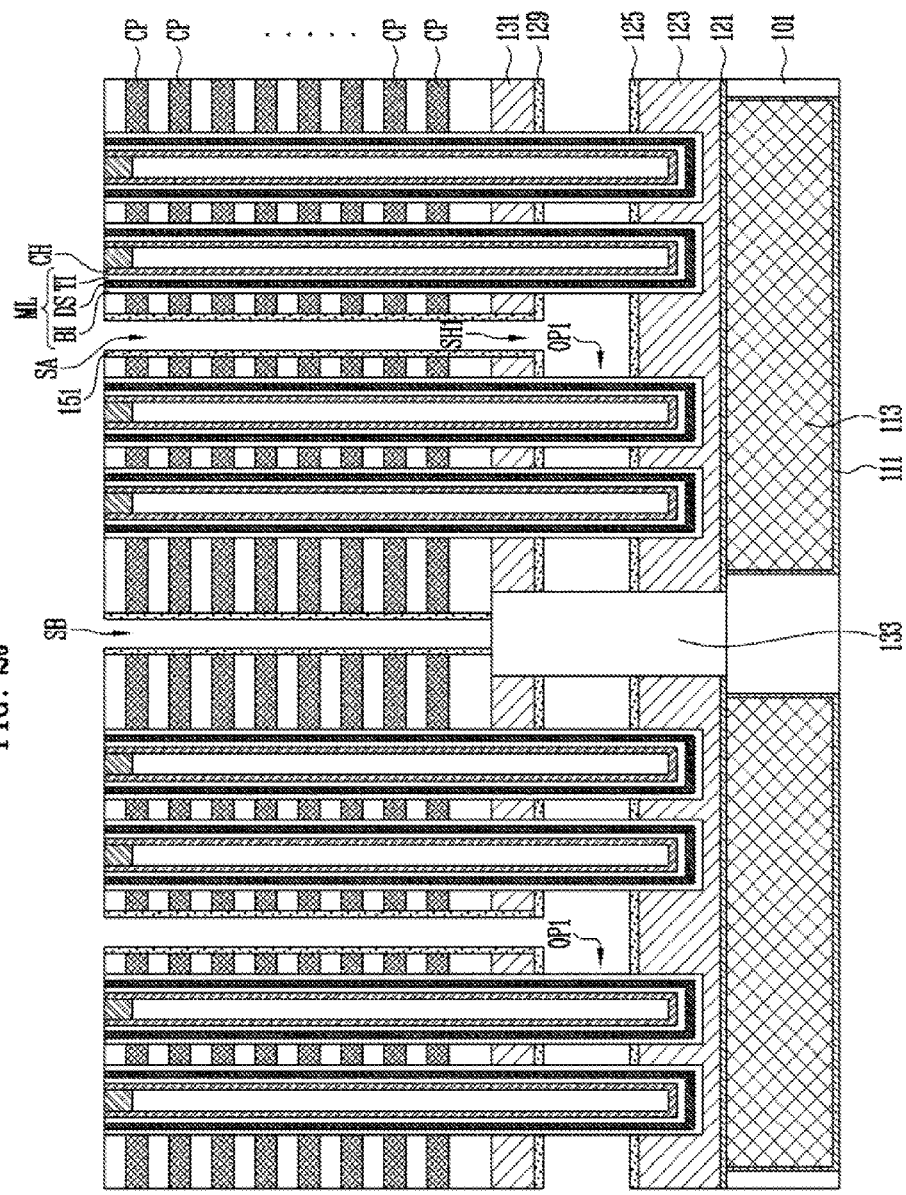

Next, referring to FIG. 2J, the sacrificial layer 127 exposed through the first and second source penetration holes SH1 and SH2 is removed by selective etching, thereby forming a first opening OP1 between the first protective layer 125 and the second protective layer 129. In the process of removing the sacrificial layer 127, the first and second protective layers 125 and 129 may be used as etch stop layers, using a difference in etching selection ratio between the sacrificial layer 127 and the first and second protective layers 125 and 129. Accordingly, it is possible to prevent loss of the first source layer 123 and the second source layer 131.

A portion of the multi-layered layer ML may be exposed through the first opening OP1 formed by removing the sacrificial layer 127.

Figure 2K:
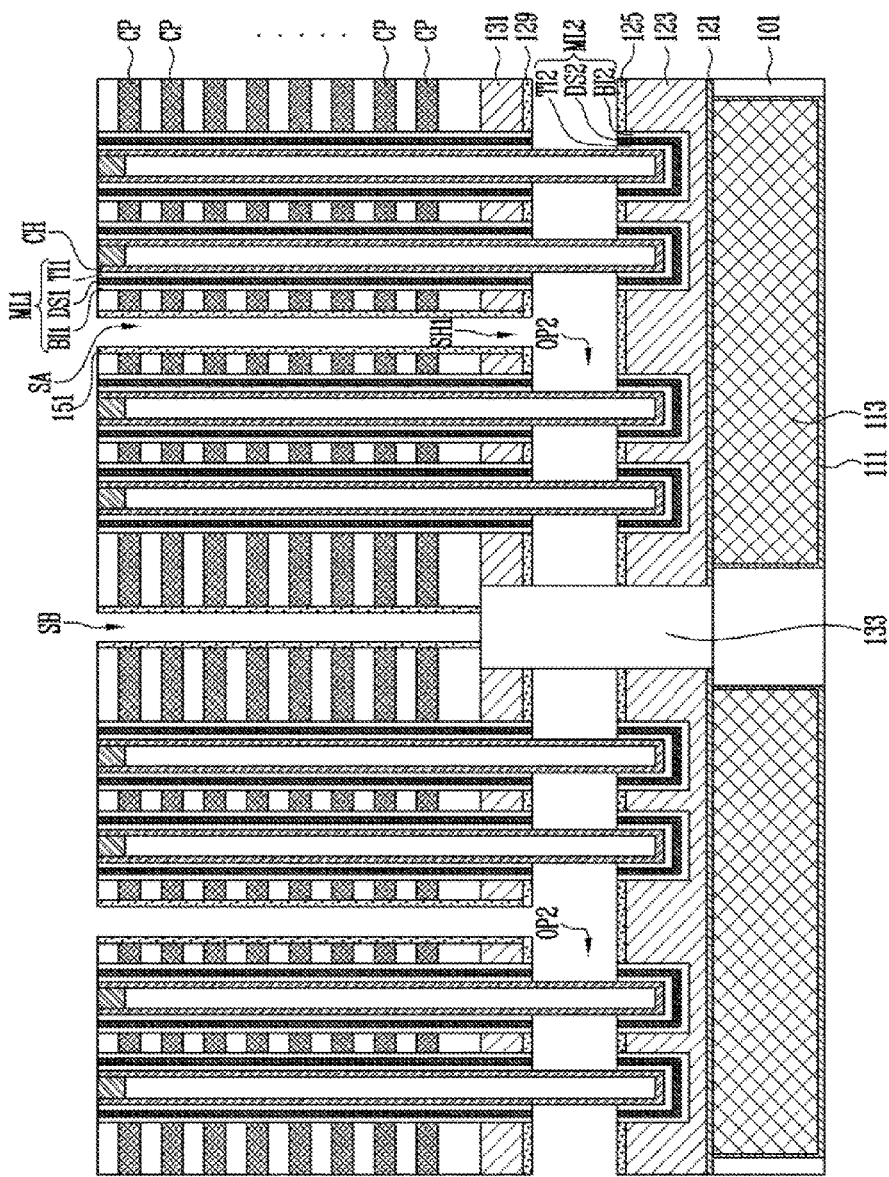

Next, referring to FIG. 2K, the portion of the exposed multi-layered layer ML is etched through the first opening OP1, thereby opening, between the first and second protective layers 125 and 129, a second opening OP2 exposing each of the channel layers CH therethrough. The second opening OP2 may form a source region OPS, together with the above-described first opening OP1 and a third opening which will be described later.

During the etching process for forming the second opening OP2, the blocking insulating layer BI may be etched to be divided into first and second blocking insulating patterns BI1 and BI2. Accordingly, the data storage layer DS is exposed. The first protective layer 125 and the second protective layer 129 are formed in a multi-layered structure including the materials described in FIG. 2B, and the third sub-protective layer (125C of FIG. 2B) formed at the uppermost portion of the first protective layer 125 and the first sub-protective layer (129A of FIG. 2B) formed at the lowermost portion of the second protective layer 129 may be formed of a material having a high etching selection ratio with respect to the blocking insulating layer BI. For example, each of the third sub-protective layer of the first protective layer 125 and the first sub-protective layer of the second protective layer 129 may be formed of a nitride layer. Accordingly, during the etching of the blocking insulating layer BI, the third sub-protective layer of the first protective layer 125 and the first sub-protective layer of the second protective layer 129 are not removed but remain, thereby serving as protective layers.

In addition, during the etching process for forming the second opening OP2, the data storage layer DS may be etched to be divided into first and second data storage patterns DS1 and DS2, and the tunnel insulating layer TI may be etched to be divided into first and second tunnel insulating patterns TI1 and TI2. When the first and second protective layers 125 and 129 are formed in a multi-layered structure including the materials described in FIG. 2B, each of the first and second protective layers 125 and 129 may include first to third sub-protective layers. The second sub-protective layers (125B and 129B of FIG. 2B) between the first and third sub-protective layers may be formed of a material having a high etching selection ratio with respect to the data storage layer DS, and the first sub-protective layer (125A of FIG. 2B) formed at the lowermost portion of the first protective layer 125 and the third sub-protective layer (129C of FIG. 2B) formed at the uppermost portion of the second protective layer 129 may be formed of a material having a high etching selection ration with respect to the tunnel insulating layer TI. For example, each of the second sub-protective layer of the first protective layer 125 and the second sub-protective layer of the second protective layer 129 may be formed of an oxide layer, and each of the first sub-protective layer of the first protective layer 125 and the third sub-protective layer of the second protective layer 129 may be formed of a nitride layer. Accordingly, during the etching of the data storage layer DS, the second sub-protective layer of the first protective layer 125 and the second sub-protective layer of the second protective layer 129 are not removed but remain, thereby serving as protective layers. Also, during the etching of the tunnel insulating layer TI, the first sub-protective layer of the first protective layer 125 and the third sub-protective layer of the second protective layer 129 are not removed but remain, thereby serving as protective layers. As described above, the multi-layered layer ML may be divided into a first multi-layered pattern ML1 and a second multi-layered pattern ML2 through the second opening OP2. During the forming of the second opening OP2, the first protective layer 125 and the second protective layer 129 are not completely removed but remain. Also, the sidewall insulating layer 151 is formed in the same multi-layered structure as the first protective layer 125 or the second protective layer 129. Hence, during the forming of the second opening OP2, the sidewall insulating layer 151 is not completely removed but remains. As a result, although the channel layers CH are exposed through the second opening OP2, the first protective layer 125 may remain to block the first source layer 123, and the second protective layer 129 and the sidewall insulating layer 151 may remain to block the second source layer 131.

Next, referring to FIG. 2L, a first region 153A of the interlayer source layer is grown from the channel layers CH exposed through the first and second openings OP1 and OP2. That is, when the interlayer source layer is grown, the interlayer source layer is first grown from its sides close to the channel layers CH. In this case, as the first region 153A of the interlayer source layer is grown from the channel layers CH, at least one portion of the second opening OP2 may be closed. A second region 153B of the interlayer source layer is grown after a step of removing the first and second protective layers 125 and 129, which will be described later.

Figure 2M:
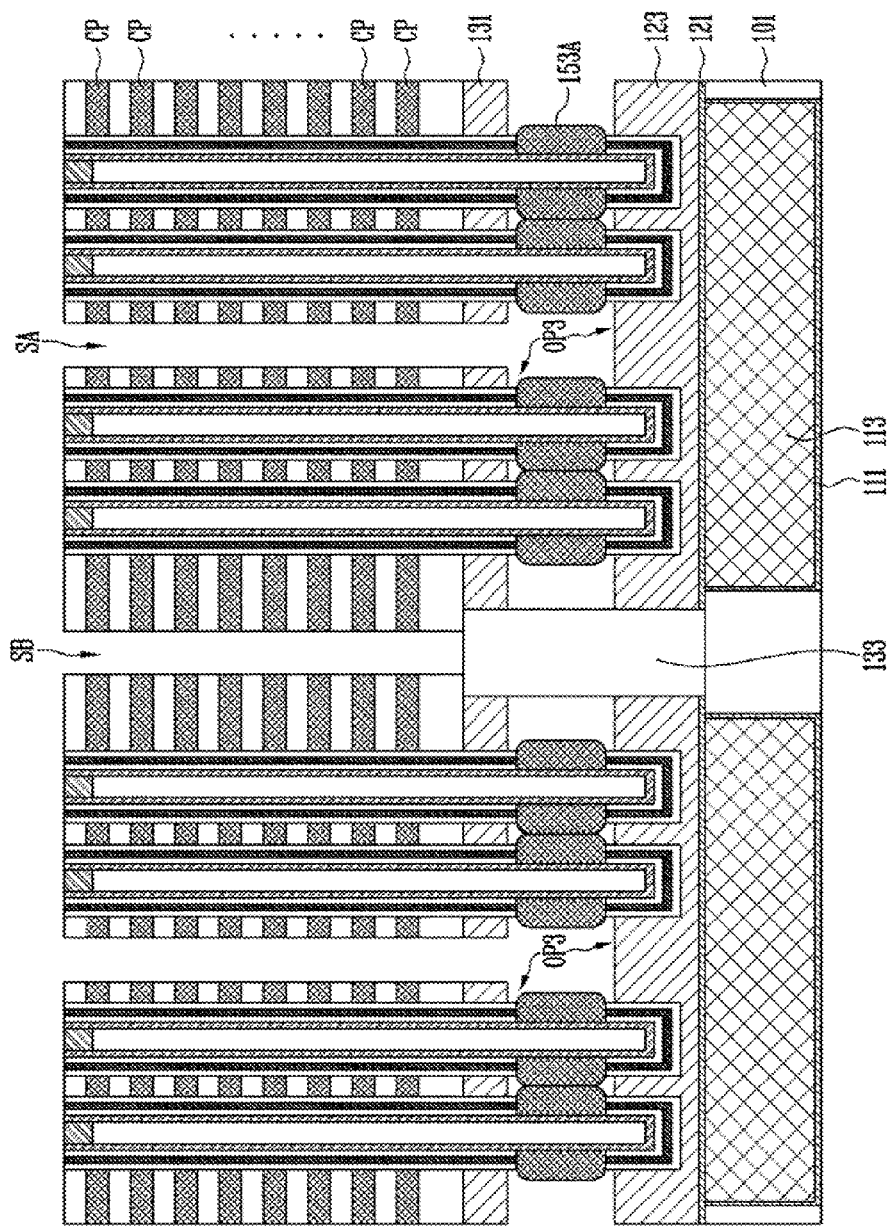

Next, referring to FIG. 2M, the first and second protective layers 125 and 129 exposed through the first opening OP1 are removed through selective etching. At this time, the sidewall insulating layer 151 is removed. Accordingly, a third opening OP3 is formed between the first source layer 123 and the second source layer 131. The third opening OP3 exposes, together with the first opening OP1, the first and second source layers 123 and 131 therethrough. In addition, as the sidewall insulating layer 151 is removed, a sidewall of the second source layer 131 is exposed through the first slit SA. In the process of removing the first and second protective layers 125 and 129, the first and second source layers 123 and 131 may be used as etch stop layers, using a difference in etching selection ratio between the first and second protective layers 125 and 129 and the first and second source layers 123 and 131.

Next, referring to FIG. 2N, the first and third openings OP1 and P3 are filled with the second region 153B of the interlayer source layer 153. The second region 153B of the interlayer source layer 153, as shown in this figure, may be grown, through a selective growth process, from the first and second source layers 123 and 131 exposed through the first and third openings OP1 and OP3 and the first region 153A of the interlayer source layer 153. Alternatively, the second region 153B of the interlayer source layer 153 may be formed through a coating process, e.g., a process of performing low pressure-chemical vapor deposition (LP-CVD) using polycrystalline silicon.

As described above, the first region 153A of the interlayer source layer 153 is grown from the channel layers CH before the second region 153B of the interlayer source layer 153 is formed in a state in which the first and second source layers 123 and 131 are blocked. After that, the second region 153B of the interlayer source layer 153 is grown in a state in which the first and second source layers 123 and 131 are exposed.

The Interlayer source layer 153 may be grown through an epitaxial process, and materials (e.g., $H_2$, a silicon source, etc.) required in the growth of the interlayer source layer 153 may move into the first to third openings OP1, OP2, and OP3 through the first slit SA. In this case, if the channel layers CH, the first source layer 123, and the second source layer 131 are simultaneously exposed, the interlayer source layer 153 is simultaneously grown from the channel layers CH, the first source layer 123, and the second source layer 131, and therefore, the flow path of material for the growth of the interlayer source layer 153 may be blocked before the first region 153A of the interlayer source layer 153 is filled in spaces between the channel layers CH. This is because the interlayer source layer 153 is grown fast at an entrance of the source region adjacent to the first slit SA without being blocked by the channel layers CH due to characteristics of selective poly-Si growing (SPG). If the entrance through which the materials for the growth of the interlayer source layer 153 are introduced into the source region is blocked, the growth of the polycrystalline silicon is interfered at portions close to the channel layers CH, and therefore, a plurality of void may be generated around the channel layers CH. This results in a decrease in cell current.

However, the interlayer source layer 153 is first grown from its sides close to the channel layers CH through the above-described steps, so that it is possible to secure a space for the flow of materials for growing the interlayer source layer 153 during the process of growing the interlayer source layer 153. Accordingly, the polycrystalline silicon can be grown around the channel layers CH without any void. In addition, after the polycrystalline silicon is grown around the channel layers CH, the first and second protective layers 125 and 129 are removed, so that the second region 153B of the interlayer source layer 153 can be rapidly grown using the first and second source layers 123 and 131 as growth seed layers.

Through the above-described processes, the source region OPS may be filled with the interlayer source layer 153.

Subsequently, a dopant from the first and second source layers 123 and 131 may be diffused into the interlayer source layer 153, for example through a suitable thermal process. Subsequently, the slit insulating layer described in FIG. 1 may be formed.

Figure 3:
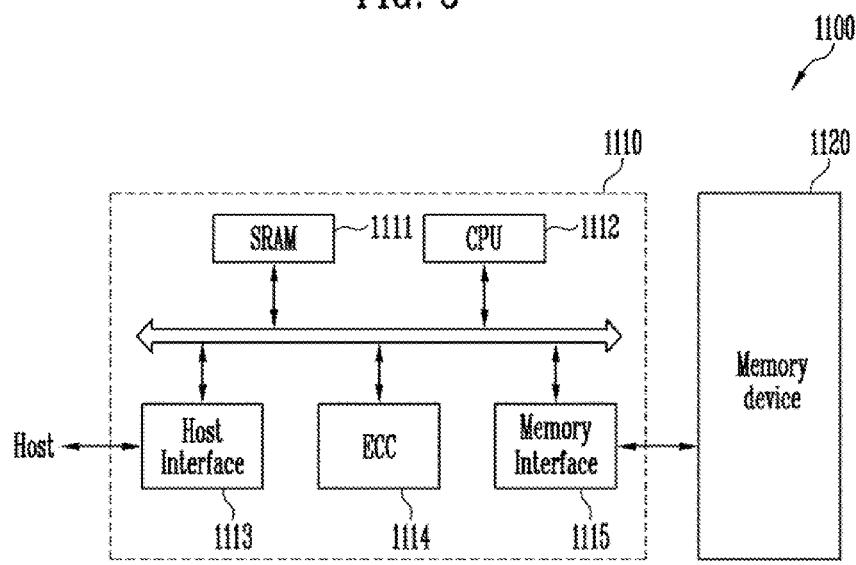
FIG. 3 is a block diagram illustrating a configuration of a memory system according to an embodiment of the present disclosure.

FIG. 3 is a block diagram illustrating a configuration of a memory system 1100 according to an embodiment of the present disclosure.

Referring to FIG. 3, the memory system 1100 according to the embodiment of the present disclosure includes a memory device 1120 and a memory controller 1110.

The memory device 1120 may include the structure described in FIGS. 1 and 2. For example, the memory device 1120 may include an interlayer source layer disposed in a sandwich structure between a first source layer and a second source layer, the interlayer source layer having a first region and a second region, which are formed with a time difference. The first region of the interlayer source layer may be formed first and may contact each of the channel layers, whereas the second region may be formed after the first region is formed and may contact the first source layer and the second source layer. The memory device 1120 may be a multi-chip package formed of a plurality of flash memory chips.

The memory controller 1110 is configured to control the memory device 1120, and may include a static random access memory (SRAM) 1111, a CPU 1112, a host interface 1113, an error correction code (ECC) 1114, a memory interface 1115 operatively linked via an internal bus. The SRAM 1111 may be used as an operation memory of the CPU 1112. The CPU 1112 may perform a general control operation for data exchange of the memory controller 1110. The host interface 1113 may include a data exchange protocol for a host connected with the memory system 1100. The ECC 1114 may detect and correct an error included in a data read from the memory device 1120, and the memory interface 1115 may provide an interface with the memory device 1120. In addition, the memory controller 1110 may further include an ROM for storing code data for interfacing with the host, and the like.

The memory system 1100 configured as described above may be a memory card or a solid state disk (SSD), in which the memory device 1120 is combined with the controller 1110. For example, when the memory system 1100 is an SSD, the memory controller 1100 may communicate with the outside (e.g., the host) through one among various interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, and an integrated drive electronics (IDE) protocol.

Figure 4:
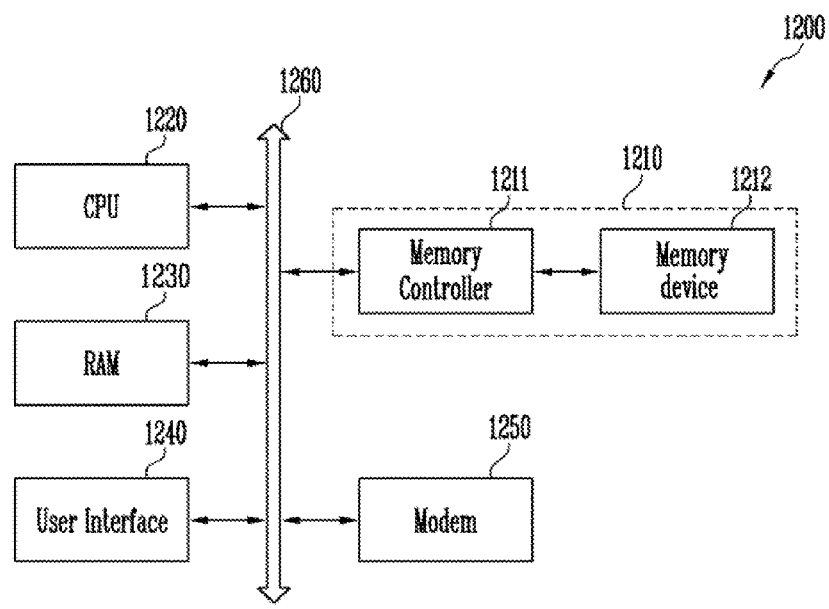
FIG. 4 is a block diagram illustrating a configuration of a computing system according to an embodiment of the present disclosure.

FIG. 4 is a block diagram illustrating a configuration of a computing system 1200 according to an embodiment of the present disclosure.

Referring to FIG. 4, the computing system 1200 may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a camera image processor (CIS), a mobile D-RAM, and the like may be further included.

The memory system 1210, as described with reference to FIG. 3, may be configured with a memory device 1212 and a memory controller 1211.

According to the present disclosure, a manufacturing process is controlled so that the interlayer source layer is first grown from the channel layer. This prevents formation of any voids in the interlayer source layer. Accordingly, it is possible to reduce the interface resistance between the channel layer and the interlayer source layer and to more stably secure cell current, thereby improving the operational reliability of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method for manufacturing a semiconductor device, the method comprising:
   forming a preliminary source stack structure including a first source layer, a first protective layer, a sacrificial layer, a second protective layer, and a second source layer, which are sequentially stacked in the recited order;
   forming channel layers extending through the second source layer and partially inside the first source layer; and
   growing a first region of an interlayer source layer from each channel layer, the first region of the interlayer source layer surrounding each channel layer in a region between the first and second protective layers.

2. The method of claim 1, wherein the growing of the first region of the interlayer source layer further comprises:
   surrounding each of the channel layers with a multi-layered layer;
   forming, between the channel layers, a source penetration hole penetrating the second source layer and the second protective layer, the source penetration hole exposing the sacrificial layer therethrough;
   removing the sacrificial layer exposed through the source penetration hole, thereby forming a first opening between the first and second protective layers;
   removing the multi-layered layer exposed through the first opening, thereby forming a second opening exposing the channel layers therethrough; and
   growing the first region of the interlayer source layer from each of the channel layers exposed through the second opening.

3. The method of claim 2, further comprising:
removing the first and second protective layers exposed through the first opening, thereby forming a third opening between the first and second source layers; and
growing a second region of the interlayer source layer from the first and second source layers exposed through the first and third openings, and the first region of the interlayer source layer.

4. The method of claim 2, further comprising:
removing the first and second protective layers exposed through the first opening, thereby forming a third opening between the first and second source layers; and
forming, through a coating process, a second region of the interlayer source layer between the first region and the first source layer exposed through the first and third openings, and between the first region and the second source layer exposed through the first and third openings.

5. The method of claim 2, wherein the first and second protective layers remain during the forming of the second opening, thereby blocking the first and second source layers during the forming of the first region of the interlayer source layer.

6. The method of claim 2, wherein the multi-layered layer includes a tunnel insulating layer surrounding each of the channel layers, a data storage layer surrounding the tunnel insulating layer, and a blocking insulating layer surrounding the data storage layer.

7. The method of claim 6, wherein each of the first protective layer and the second protective layer includes:
a first sub-protective layer having a different etching selection ratio from the tunnel insulating layer;
a second sub-protective layer having a different etching selection ratio from the data storage layer; and
a third sub-protective layer having a different etching selection ratio from the blocking insulating layer.

8. The method of claim 2, further comprising forming, on a sidewall of the source penetration hole, a sidewall insulating layer including the same material as the first protective layer or the second protective layer.

9. The method of claim 8, wherein the sidewall insulating layer is removed after the growing of the first region of the interlayer source layer.

10. The method of claim 2, further comprising, before the forming of the channel layers, alternately stacking first material layers and second material layers on the second source layer,
wherein the channel layers are formed to penetrate the first material layers and the second material layers, and
wherein the method further comprises, before the forming of the source penetration hole, forming a slit penetrating the first material layers and the second material layers between the channel layers.

11. The method of claim 10, further comprising, before the forming of the source penetration hole, replacing the first material layers or the second material layers with a third material layer through the slit.

12. The method of claim 1, wherein the sacrificial layer is formed of a material having a different etching selection ratio from the first and second source layers.

13. The method of claim 1, wherein each of the first protective layer and the second protective layer has a first sub-protective layer including a nitride layer, a second sub-protective layer disposed on the first sub-protective layer, the second sub-protective layer including an oxide layer, and a third sub-protective layer disposed on the second sub-protective layer, the third sub-protective layer including a nitride layer.

14. The method of claim 1, wherein the first and second protective layers are formed of a material having a different etching selection ratio from the first source layer, the sacrificial layer, and the second source layer, and are removed after the growing of the first region of the interlayer source layer.

* * * * *